United States Patent
Kim et al.

(10) Patent No.: US 7,881,139 B2
(45) Date of Patent: *Feb. 1, 2011

(54) SEMICONDUCTOR MEMORY DEVICE WITH TEMPERATURE SENSING DEVICE AND OPERATION THEREOF

(75) Inventors: Kyung-Hoon Kim, Kyoungki-do (KR); Patrick B. Moran, Eugene, OR (US)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/463,838

(22) Filed: May 11, 2009

(65) Prior Publication Data
US 2009/0245325 A1    Oct. 1, 2009

Related U.S. Application Data

(63) Continuation of application No. 11/647,409, filed on Dec. 29, 2006, now Pat. No. 7,551,501.

(30) Foreign Application Priority Data

Apr. 3, 2006   (KR) ...................... 10-2006-0030289
May 31, 2006   (KR) ...................... 10-2006-0049134

(51) Int. Cl.
*G11C 7/00*    (2006.01)
*G11C 8/00*    (2006.01)

(52) U.S. Cl. ............. 365/211; 365/189.05; 365/189.08; 365/189.09; 365/189.12; 365/236

(58) Field of Classification Search ................. 365/211, 365/189.05, 189.08, 189.09, 189.12, 194, 365/236; 327/513
See application file for complete search history.

(56) References Cited

U.S. PATENT DOCUMENTS 5,784,328 A * 7/1998 Irrinki et al. ................ 365/222

(Continued)

FOREIGN PATENT DOCUMENTS

CN    1567211    1/2005

(Continued)

OTHER PUBLICATIONS

Notice of Preliminary Rejection issued from Chinese State Intellectual Property Office on May 26, 2010.

(Continued)

*Primary Examiner*—Trong Phan
(74) *Attorney, Agent, or Firm*—IP & T Group LLP

(57) ABSTRACT

A semiconductor memory device includes a thermosensor that senses present temperatures of the device and confirms whether the temperature values are valid. The thermosensor includes a temperature sensing unit, a storage unit and an initializing unit. The temperature sensing unit senses temperatures in response to a driving signal. The storage unit stores output signals of the temperature sensing unit and outputs temperature values. The initializing unit initializes the storage unit after a predetermined time from an activation of the driving signal. A driving method includes driving the thermosensor in response to the driving signal, requesting a re-driving after a predetermined time from the activation of the driving signal, and re-driving the thermosensor in response to the driving signal input again.

10 Claims, 7 Drawing Sheets

U.S. PATENT DOCUMENTS

| | | | |
|---|---|---|---|
| 5,956,289 A * | 9/1999 | Norman et al. | 365/211 |
| 6,002,627 A * | 12/1999 | Chevallier | 365/211 |
| 6,233,190 B1 * | 5/2001 | Cooper et al. | 365/211 |
| 6,438,057 B1 * | 8/2002 | Ruckerbauer | 365/211 |
| 6,453,218 B1 * | 9/2002 | Vergis | 365/211 |
| 6,661,724 B1 * | 12/2003 | Snyder et al. | 365/211 |
| 6,662,278 B1 * | 12/2003 | Kahn et al. | 365/211 |
| 6,775,196 B2 * | 8/2004 | Perner et al. | 365/211 |
| 6,958,929 B2 * | 10/2005 | Abraham et al. | 365/211 |
| 7,035,157 B2 * | 4/2006 | Chang | 365/211 |
| 7,038,968 B2 * | 5/2006 | Kim | 365/211 |
| 7,064,994 B1 * | 6/2006 | Wu | 365/211 |
| 7,075,847 B2 * | 7/2006 | Kim et al. | 365/211 |
| 7,145,823 B2 * | 12/2006 | Jain et al. | 365/211 |
| 7,248,527 B2 * | 7/2007 | Park | 365/211 |
| 7,260,007 B2 * | 8/2007 | Jain et al. | 365/211 |
| 7,266,031 B2 * | 9/2007 | Kim et al. | 365/211 |
| 7,292,488 B2 * | 11/2007 | Hokenmaier et al. | 365/211 |
| 7,296,928 B2 * | 11/2007 | Bowden et al. | 327/513 |
| 2005/0141311 A1 | 6/2005 | Kim et al. | |
| 2006/0023546 A1 | 2/2006 | Park | |

FOREIGN PATENT DOCUMENTS

| | | |
|---|---|---|
| TW | 550567 | 9/2003 |
| TW | 200423131 | 11/2004 |

OTHER PUBLICATIONS

Office Action Issued by the Taiwanese Patent Office on Apr. 28, 2009 with English Translation.

* cited by examiner

SEMICONDUCTOR MEMORY DEVICE WITH TEMPERATURE SENSING DEVICE AND OPERATION THEREOF

CROSS-REFERENCE TO RELATED APPLICATION

The present application is a continuation of U.S. patent application Ser. No. 11/647,409 filed on Dec. 29, 2006, now U.S. Pat. No. 7,551,501, which claims priority to Korean patent applications Nos. 10-2006-0030289 and 10-2006-0049134, filed in the Korean Patent Office on Apr. 3, 2006 and May 31, 2006 respectively, the entire disclosure of each of which is incorporated herein by reference.

BACKGROUND OF THE INVENTION

The present invention relates to a semiconductor memory device; and, more particularly, to the semiconductor memory device with a temperature sensing device.

A semiconductor memory device is generally provided with plural cells for storing data, wherein each cell includes a transistor for switching to transmit charges and a capacitor for storing the charges, i.e., data. The term 'data storage' in the unit cell means the condition in which electric charges are accumulated in the capacitor. Accordingly, it is possible to store data in the unit cell without any electric power consumption in principle.

Undesirably, a leakage current is generated from a PN junction of MOS transistors and capacitors. As time progresses, the amount of initial charge stored is reduced and the data can disappear. Accordingly, in order to prevent a data loss, after operation to read the data stored in the cell, recharging the cell with the initial charge according to read data is required.

Data stored in the unit cells of memory are preserved by repeating the recharging operation periodically. The recharging operation is generally called a refresh operation. The refresh operation is controlled by a DRAM controller. DRAM consumes electric power periodically for the refresh operation. How to decrease the electric power consumption in a battery operated system such as a mobile device including a notebook, a PDA (Personal Digital Assistants) or a cellular phone, is a critical issue because lower electric power consumption is required.

A device for sensing the temperature precisely in the DRAM and outputting sensed information is required. As one of the methods for decreasing the electric power consumption during the refresh operation, changing a period of the refresh operation according to temperature is generally performed. With a temperature decrease, the data can be preserved longer in the DRAM without the refresh operation. First, a plurality of temperature ranges are determined. Then, a low frequency refresh clock for controlling the refresh operation is set up in a low temperature range. The refresh clock represents a signal enabled in the refresh operation. Consequently, the electric power consumption is reduced, since the refresh operation is performed less frequently at lower temperature.

As the integration rate or operation speed of a semiconductor memory device increases, the semiconductor memory device generates greater heat. The heat increases the internal temperature of the semiconductor memory device and affects normal operation. Consequently, the device for sensing the temperature within the DRAM precisely and outputting sensed information, i.e., a thermosensor, is required.

FIG. 1 is a block diagram of a conventional thermosensor in a semiconductor memory device. The thermosensor includes a temperature sensing unit 10, a multipurpose register (MPR) unit 20 and an output driver 30. The temperature sensing unit 10 senses temperatures in response to a driving signal ODTS_EN. The MPR unit 20, storing output signals TM_VAL[0:N] of the temperature sensing unit 10, outputs stored values MPR[0:N] in response to an output activation signal RD_ODTS. The output driver 30 outputs temperature signals ODTS_DT[0:N].

FIG. 2 is a schematic circuit diagram of the MPR unit 20 described in FIG. 1. The MPR unit 20 includes a plurality of latch units for storing the output signals TM_VAL[0:N] into bit-unit. The plurality of latch units have substantially same structures. One latch unit is described.

A first latch unit includes a latch 22 and a transmission gate TG1. The latch 22 latches the output signals TM_VAL[0:N]. The transmission gate TG1 transmits output data of the latch 22 in response to the output activation signal RD_ODTS.

FIG. 3 is a timing diagram for describing an operation of the thermosensor shown in FIG. 1. Values of a signal TEMP, i.e., T−1, T, T+1, and T+2, represent present temperatures inside the semiconductor memory device.

The temperature sensing unit 10 senses the present temperature valued at T degrees in response to the [N]th driving signal ODTS_EN[N]. The MPR unit 20 stores the output signal of the temperature sensing unit 10 as a [N]th temperature value [N]th ODTS Data. Before the output signal is input from the temperature sensing unit 10, the MPR unit 20 has stored the previous output signal as a [N−1]th temperature value [N−1]th ODTS Data.

At a predetermined time after an input timing of the [N]th driving signal, the output activation signal RD_ODT is input. The MPR unit 20 outputs the stored value MPR[N] in response to the output activation signal RD_ODTS. The output driver 30 outputs the temperature signal ODTS_DT[N] in FIG. 1, representing T degrees.

While the thermosensor outputs the present temperature valued at T degrees, the temperature of the semiconductor memory device has changed from T degrees to (T+2) degrees. The thermosensor cannot actually represent the present temperature of the semiconductor memory device.

According to a specification of Joint Electron Device Engineering Council (JEDEC), the refresh operation is required to perform in a period of 64 ms when the temperature of the device is less than 85° C. degrees. The refresh operation is required to perform in a period of 32 ms when the temperature of the device is more than the 85° C. degrees.

When the MPR unit 20 stores the [N]th temperature value as 83° C. degrees and the present temperature increases over 85° C. degrees, the thermosensor outputs the temperature signal ODTS_DT[N], representing 83° C. degrees. The refresh operation is performed in a period of 64 ms. However, the present temperature is over 85° C. degrees actually and the refresh operation is required to be performed in a period of 32 ms. Due to an inappropriate refresh operation, the data can be lost.

The thermosensor maintains the temperature values stored in MPR unit before subsequent driving signals are input. The conventional thermosensor cannot represent the temperature changes of the semiconductor memory device precisely.

SUMMARY OF THE INVENTION

A thermosensor of a semiconductor memory device in accordance with the present invention senses the present temperature of the device and confirms whether temperature values are valid or not.

In accordance with an embodiment of the present invention, the thermosensor includes a temperature sensing unit for sensing temperatures in response to a driving signal, a storage unit for storing output signals of the temperature sensing unit and outputting temperature values, and an initializing unit for initializing the storage unit after a predetermined time from an activation of the driving signal.

In accordance with another embodiment of the present invention, a driving method of the semiconductor memory device includes driving the thermosensor in response to the driving signal, requesting re-driving after a predetermined time from the activation of the driving signal, and re-driving the thermosensor in response to the driving signal input again.

DESCRIPTION OF SPECIFIC EMBODIMENTS

After a predetermined time passes from a timing of its driving, a thermosensor of a semiconductor memory device in accordance with the present invention outputs a request signal for re-driving. The thermosensor senses the temperature of the semiconductor memory device through the re-driving at predetermined times. The semiconductor memory device stably performs operations related to the temperature such as a refresh operation. The reliability of the semiconductor memory device is thereby improved.

Hereinafter, a semiconductor memory device in accordance with the present invention will be described in detail referring to the accompanying drawings.

Figure 1:
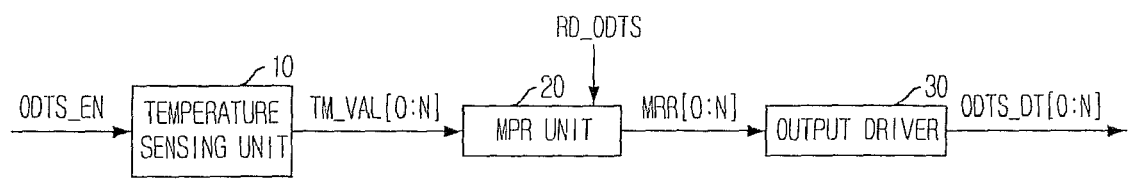
FIG. 1 is a block diagram of a conventional thermosensor in a semiconductor memory device.
Figure 2:
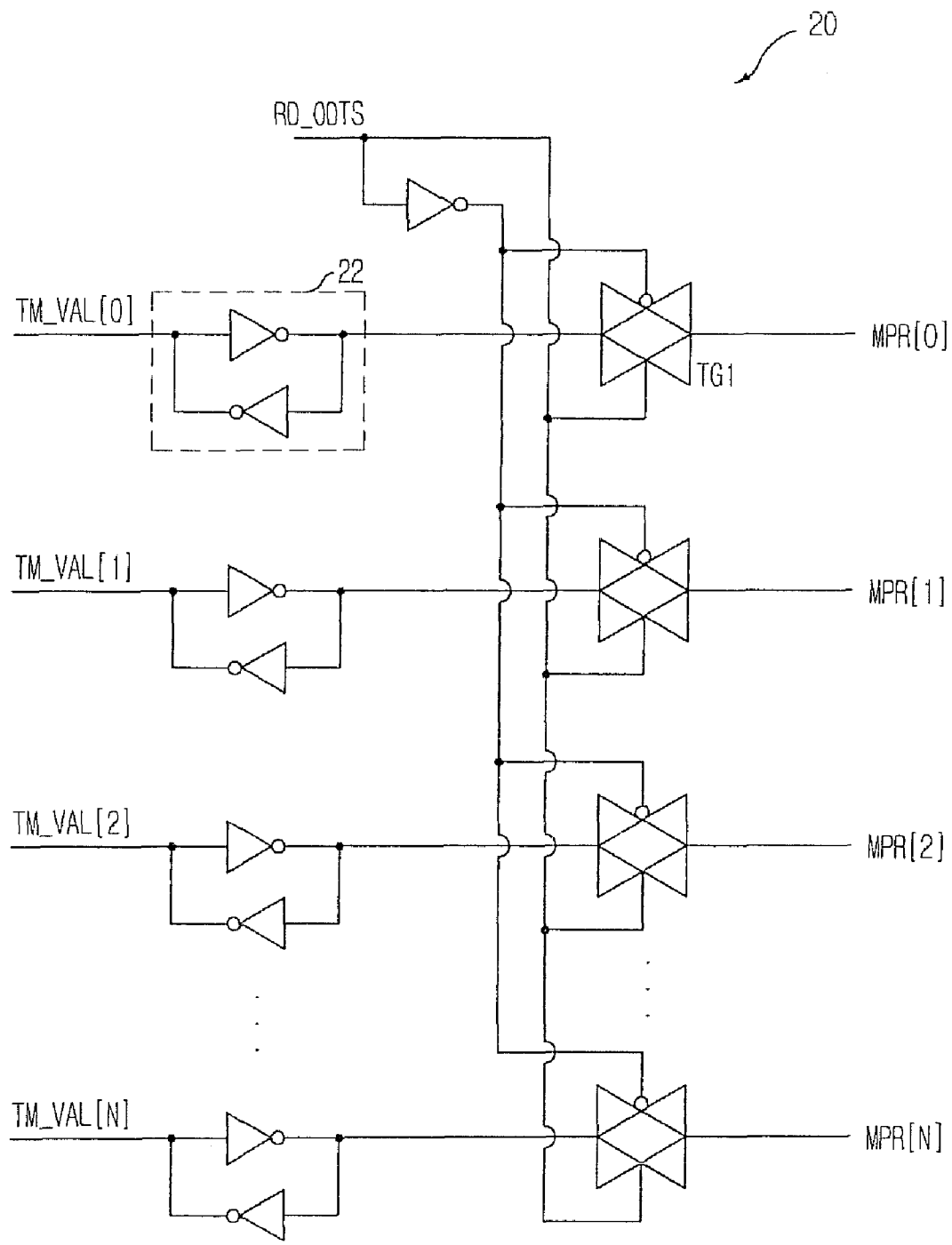
FIG. 2 is a schematic circuit diagram of a MPR unit described in FIG. 1.
Figure 3:
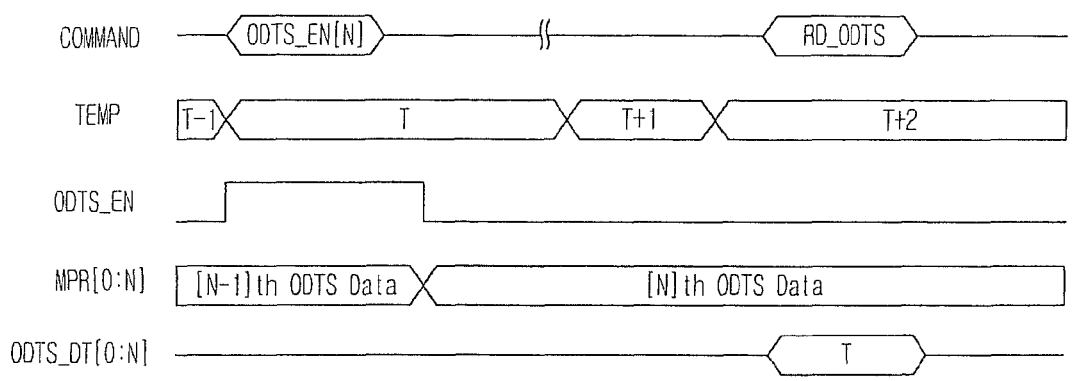
FIG. 3 is a signal timing diagram of the thermosensor described in FIG. 1.
Figure 4:
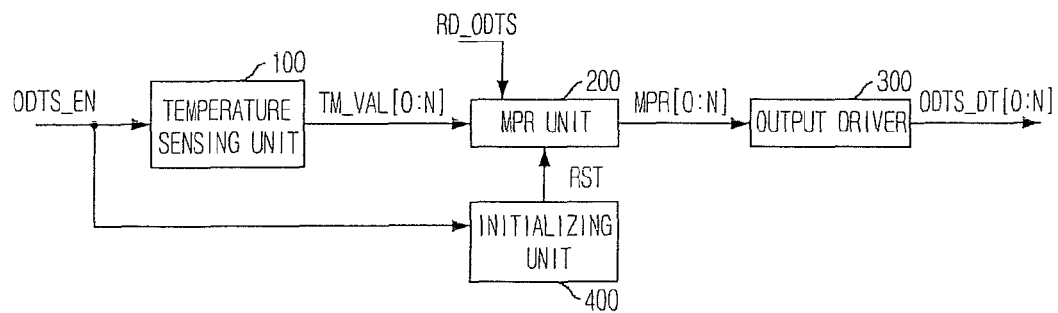
FIG. 4 is a block diagram of a thermosensor of a semiconductor memory device in accordance with the present invention.

FIG. 4 is a block diagram of a thermosensor in a semiconductor memory device in accordance with the present invention. The thermosensor includes a temperature sensing unit 100, a storage unit which is provided with a MPR unit 200 and an output driver 300, and initializing unit 400.

The temperature sensing unit 100 senses temperatures in response to a driving signal ODTS_EN. The MPR unit 200, storing output signals TM_VAL[0:N] of the temperature sensing unit 100, outputs stored values MPR[0:N] in response to an output activation signal RD_ODTS. The MPR unit 200 initializes the stored values MPR[0:N] in response to an initializing signal RST. The output driver 300 drives the outputs MPR[0:N] of the MPR unit 200 as temperature signals ODTS_DT[0:N]. The initializing unit 400 initializes the MPR unit 200 at a predetermined time after an activation of the driving signal ODTS_EN.

Accordingly, the stored temperature value is initialized at a predetermined time after the activation of the driving signal ODTS_EN. Through the initialized temperature value, a chipset is informed that the present temperature is not reflected, generating a new driving signal. That is, the thermosenor can request the chipset to generate the new driving signal by initializing the temperature value.

Figure 5:
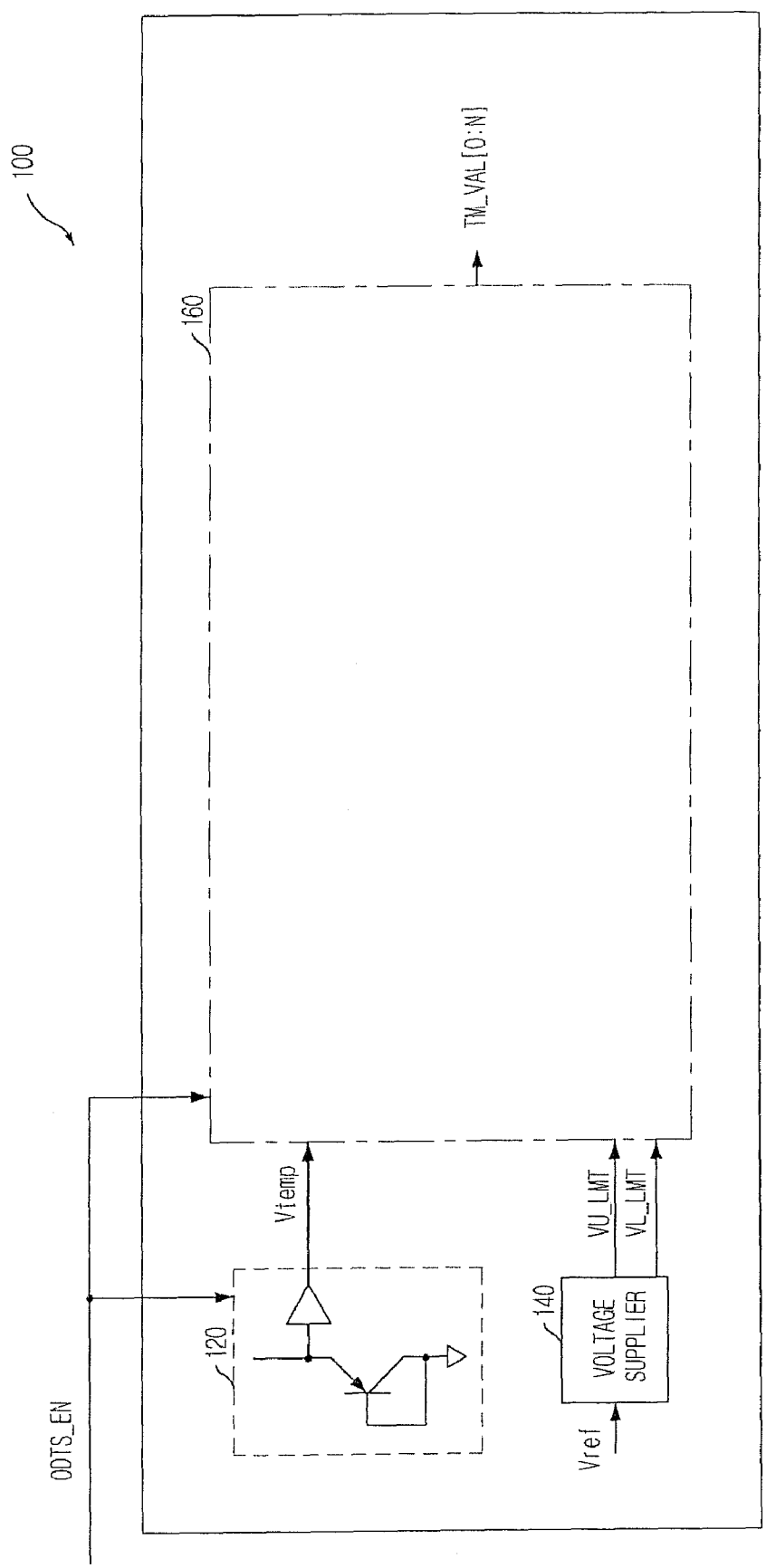
FIG. 5 is a block diagram of a temperature sensing unit described in FIG. 4.

FIG. 5 is a block diagram of the temperature sensing unit 100 described in FIG. 4. The temperature sensing unit 100 includes a temperature sensor 120, a voltage supplier 140 and a converter unit 160. The temperature sensor 120 senses a temperature in response to the driving signal ODTS_EN. The voltage supplier 140 supplies an upper limit voltage VU_LMT and a lower limit voltage VL_LMT in response to a reference voltage Vref which is not under the influence of temperature and power supply voltage variation of the semiconductor memory device. The converter unit 160 converts an analog signal Vtemp into digital signals TM_VAL[0:N] based on the upper limit voltage VU_LMT and the lower limit voltage VL_LMT in response to the driving signal ODTS_EN. The converter unit 160 is provided with a tracking Analog to Digital Converter (ADC) which tracks an analog output Vtemp of the temperature sensor 120 in a bit unit and converts the same into the digital signals TM_VAL[0:N].

In operation, the temperature sensor 120 senses the present temperature in response to an activation of the driving signal ODTS_EN. The converter unit 160 converts the output of the temperature sensor 120, i.e., the analog signal Vtemp, into the digital signals TM_VAL[0:N] based on the upper limit voltage VU_LMT and the lower limit voltage VL_LMT.

Figure 6:
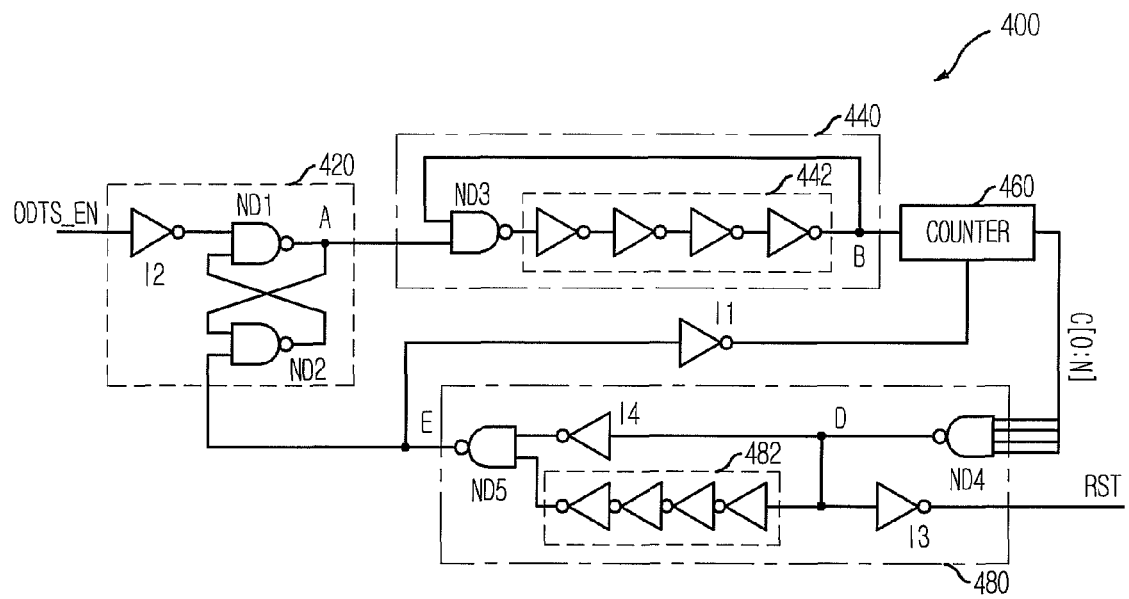
FIG. 6 is a schematic circuit diagram of an initializing unit described in FIG. 4.

FIG. 6 is a schematic circuit diagram of the initializing unit 400 of FIG. 4. The initializing unit 400 includes a latch 420, a period signal generator 440, a counter 460, a signal generator 480 and an inverter I1. The latch 420 activates an output signal A in response to the driving signal ODTS_EN and inactivates the output signal A in response to a reset signal E. The period signal generator 440 generates a period signal B during activation of the output signal A. The counter 460 counts the number of period signal B that is activated. The signal generator 480 generates the initializing signal RST and a reset signal E in response to an output of the counter 460. The first inverter I1 inverts the reset signal E and transmits to the counter 460.

The latch 420 is provided with an inverter I2 and two NAND gates ND1 and ND2. The second inverter I2 inverts the driving signal ODTS_EN. The first NAND gate ND1, receiving an output of the second inverter I2, is cross-coupled with the second NAND gate ND2, receiving the reset signal E.

The period signal generator 440 is provided with a NAND gate ND3 and an inverter chain 442. The third NAND gate receives the output signal A and the period signal B. The first inverter chain 442, delaying an output of the third NAND gate ND3, outputs the period signal B.

The counter 460, counting the number of the activation of the period signal B, outputs a plurality of signals C[0:N]. The counter 460 initializes the signals C[0:N] in response to the reset signal E delayed by the first inverter I1.

The signal generator 480 is provided with two NAND gates ND4 and ND5, two inverters I3 and I4, and an inverter chain 482. The fourth NAND gate ND4 receives the signals C[0:N]. The third inverter I3, inverting an output signal D of the fourth NAND gate ND4, outputs the initializing signal RST. The fourth inverter I4 inverts the output signal D. The second inverter chain 482 delays the output signal D. The fifth NAND gate ND5, receiving outputs of the fourth inverter I4 and the second inverter chain 482, outputs the reset signal E.

Figure 7:
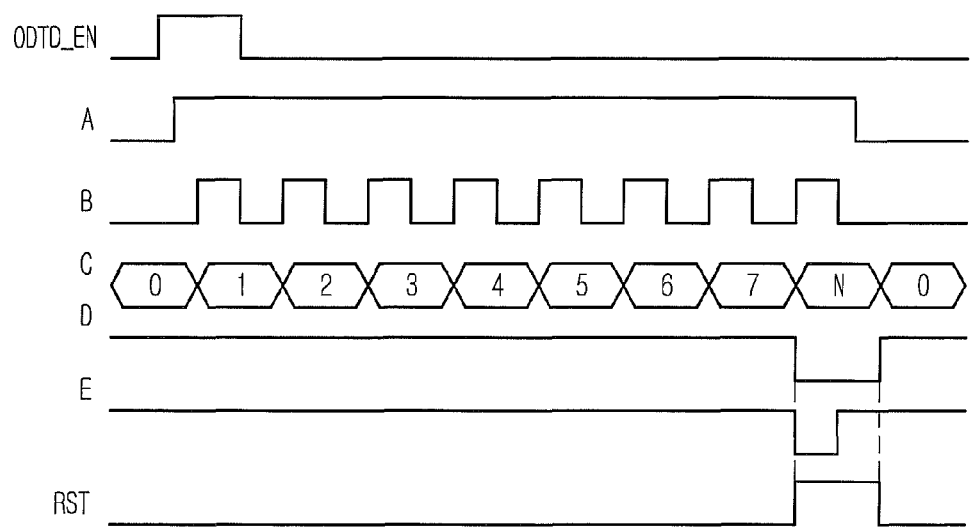
FIG. 7 is a signal timing diagram of the initializing unit described in FIG. 6.

FIG. 7 is a signal timing diagram of the initializing unit 400 described in FIG. 6. When the driving signal ODTS_EN is activated, the latch 420 activates the output signal A. The period signal generator 440 generates the period signal B having a predetermined frequency during activation of the output signal A. The counter 460, counting the number of the activation of the period signal B, outputs the signals C[0:N] i.e., a first-nine signals 0-N. In the signal generator 480, the fourth NAND gate ND4 inactivates the signal D when all signals C[0:N] are activated. The third inverter I3, inverting the signal D, activates initializing signal RST. The reset signal E is activated after a delay time of the second inverter chain 482 from the inactivation of the signal D. The latch inactivates the output signal A in response to the reset signal E. The operation of the period signal generator 440 is terminated. Meanwhile, the counter 460 is initialized in response to the inverted reset signal.

The initializing signal RST is activated when the [N]th signal C[N] is activated, which can be changed according to a maximum counting number set in the counter 460. Accordingly, a period from the activation of the driving signal ODTS_EN to the activation of the initializing signal RST is controlled by determining the period of the period signal B and the maximum counting number of the counter 460.

Figure 8:
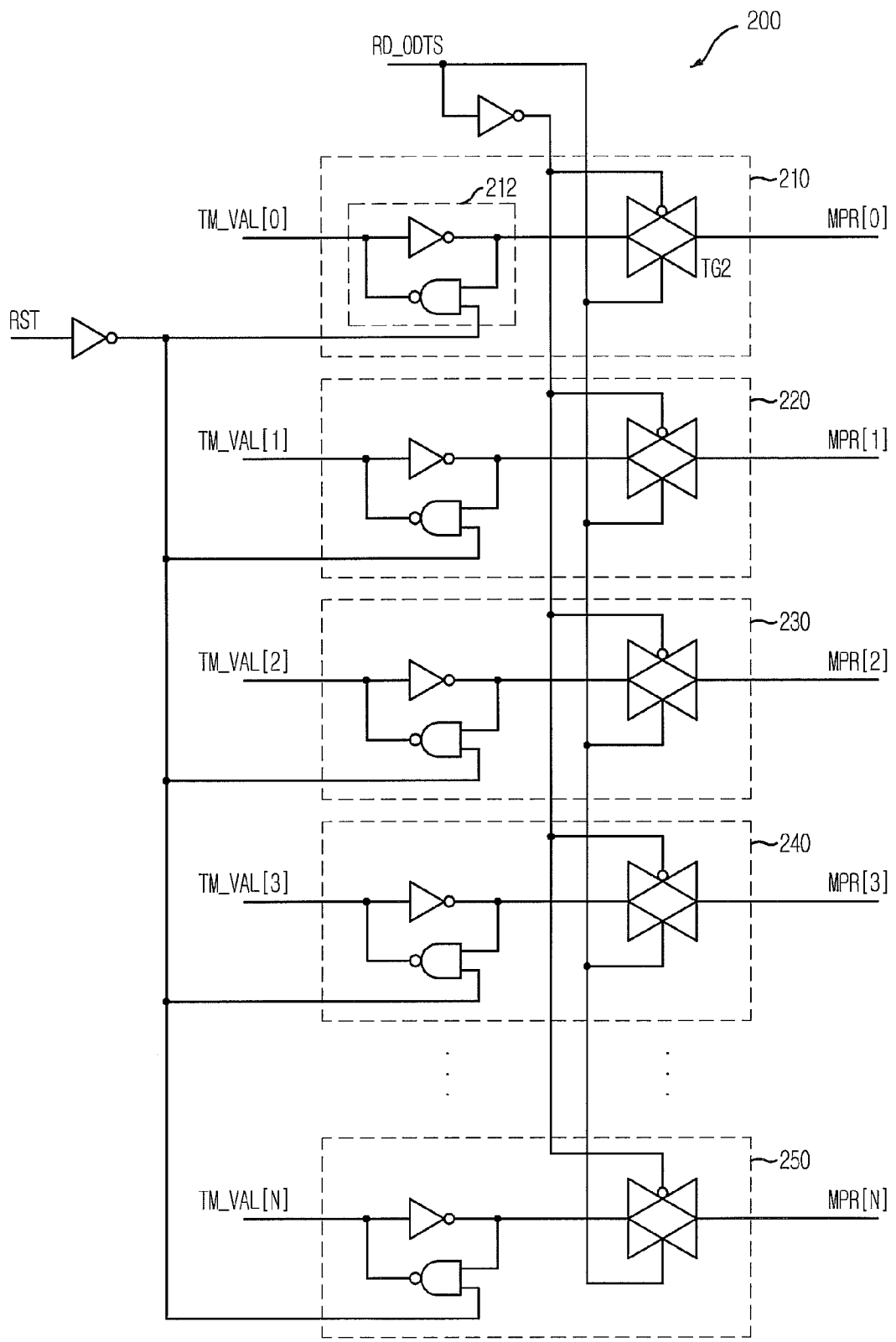
FIG. 8 is a schematic circuit diagram of a MPR unit described in FIG. 4.

FIG. 8 is a schematic circuit diagram of a MPR unit 200 described in FIG. 4. The MPR unit 200 includes a plurality of latch units 210 to 250 for storing the output signals TM_VAL [0:N] of the temperature sensing unit 100 into unit bits. The plurality of latch units 210 to 250 have substantially same structures respectively. Herein, for example, one latch unit is described.

A first latch unit 210 includes a latch 212 and a transmission gate TG2. The latch 212 latches the output signals TM_VAL[0:N] and is reset in response to the initializing signal RST. The transmission gate TG2 transmits an output data of the latch 212 in response to the output activation signal RD_ODTS.

The MPR unit 200 latches the output signals TM_VAL[0: N] of the temperature sensing unit 100 and outputs latched values MPR[0:N] in response to the output activation signal RD_ODTS. The MPR unit 200 resets stored values in response to the activation of the initializing signal RST.

Figure 9:
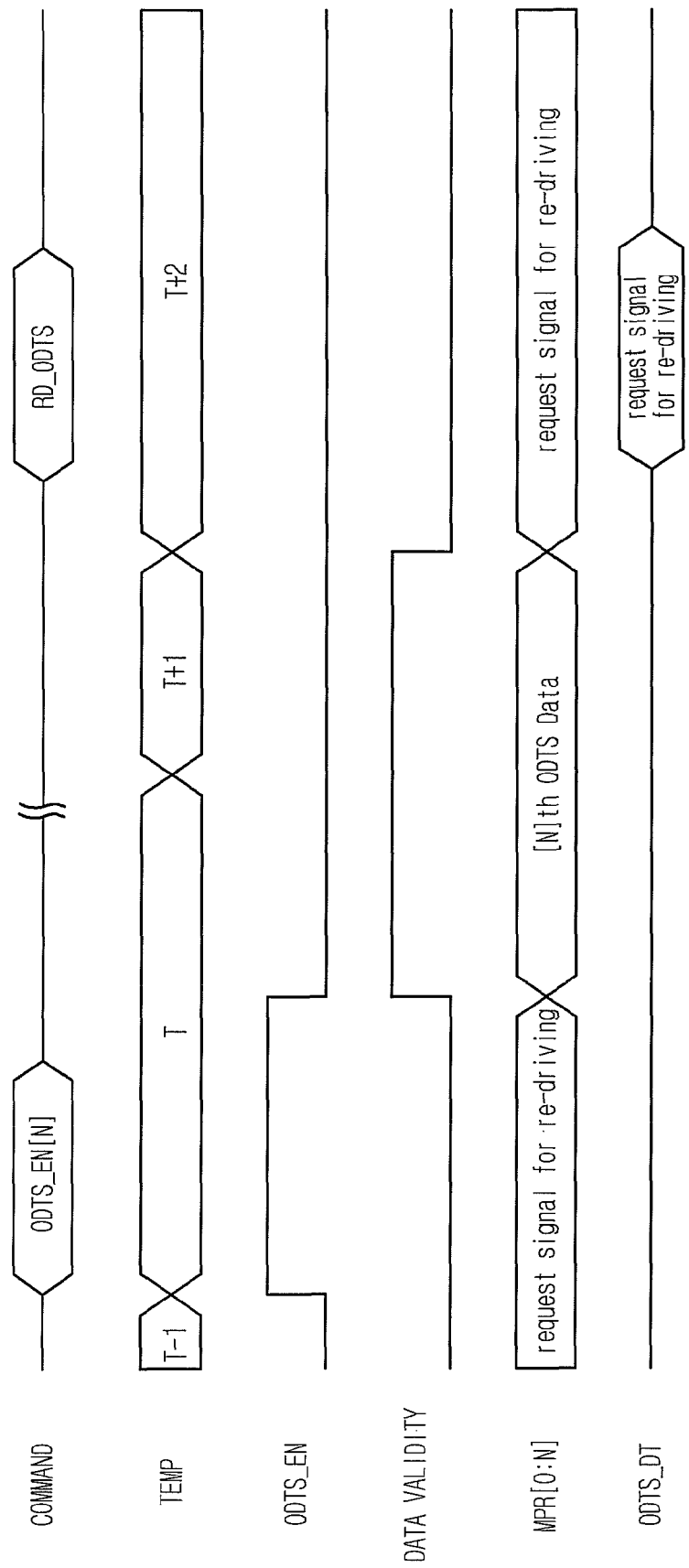
FIG. 9 is a signal timing diagram of the thermosensor described in FIG. 4.

FIG. 9 is a signal timing diagram of the thermosensor of FIG. 4. Values of a signal TEMP i.e., T−1, T, T+1, T+2, represent temperatures inside the semiconductor memory device. The temperature sensing unit 100 senses the present temperature valued at T degrees in response to the [N]th driving signal ODT_EN[N]. The MPR unit 200 stores the output signal of the temperature sensing unit 100 as a [N]th temperature value.

The initializing unit 400 activates the initializing signal RST after the predetermined time from the activation of the driving signal ODTS_EN. The initializing signal RST initializes the MPR unit 200. Accordingly, a valid period of the data DATA VALIDITY, based on the sensed temperature, is from when the MPR unit 200 stores new temperature value until the initializing signal RST is activated.

Thereafter, the output activation signal RD_ODTS is input. The MPR unit 200 and the output driver 300 output the initialized value, i.e., the request signal for re-driving, as the temperature signal ODTS_DT. The chipset, receiving not the temperature value but the request signal, generates the driving signal ODTS_EM again. The thermosensor is driven again and the MPR unit 200 stores new temperature value. When the output activation signal RD_ODTS is input, the present temperature is sensed and output.

The thermosensor of the semiconductor memory device in accordance with the present invention includes the initializing unit for initializing the MPR unit. At predetermined time after a timing of its driving, the thermosensor initializes the temperature vales. The thermosensor outputs the initialized values as the request signal for the re-driving to represent that the temperature values are not sensed for the predetermined time.

Accordingly, the semiconductor memory device, using the precise temperature values sensed by the thermosensor, stably performs internal operations related to a temperature variation such as refresh and so forth. As a result, the reliability of the semiconductor memory device is improved.

While the MPR unit outputs stored values in response to the output activation signal in the above embodiment, the output driver can be also activated in response to the output activation signal and output the stored values. The initializing unit activates the initializing signal in response to the driving signal in the above embodiment. In addition, the initializing unit can be varied according to other embodiments of the present invention. The initializing signal can be activated based on a beginning or an ending of the thermosensor operation.

While the present invention has been described with respect to the particular embodiments, it will be apparent to those skilled in the art that various changes and modifications may be made without departing from the spirit and scope of the invention as defined in the following claims.

What is claimed is:

1. A thermosensor for use in a semiconductor memory device, comprising:
   a temperature sensing unit for sensing a temperature in response to a driving signal;
   a storage unit directly coupled to the temperature sensing unit, and for storing outputs of the temperature sensing unit and outputting temperature values; and
   an initializing unit for generating a period signal that toggles during an activation of an output signal, which is activated in response to the driving signal, counting a number of toggles of the period signal, and initializing the storage unit periodically when the number of toggles reaches a preset number.

2. The thermosensor as recited in claim 1, wherein the initializing unit includes:
   a latch for setting its output signal in response to the driving signal and resetting its output signal in response to a reset signal;
   a period signal generator for generating the period signal during activation of the output signal of the latch;
   a counter for counting the number of toggles of the period signals generated by the period signal generator;
   an initializing signal generator for generating an initializing signal and a reset signal in response to an output of the counter; and
   a first inverter for inverting the reset signal and outputting an inverted reset signal to the counter.

3. The thermosensor as recited in claim 2, wherein the latch includes:
   a second inverter for inverting the driving signal; and
   first and second NAND gates cross-coupled for respectively receiving an output of the second inverter and the reset signal.

4. The thermosensor as recited in claim 3, wherein the period signal generator includes:
   a third NAND gate for receiving the output signal of the latch and the period signal; and a first inverter chain for delaying an output of the third NAND gate and outputting the period signal.

5. The thermosensor as recited in claim 4, wherein the initializing signal generator includes:
a fourth NAND gate for receiving outputs of the counter;
a third inverter for inverting an output of the fourth NAND gate and outputting the initializing signal;
a fourth inverter for inverting the output of the fourth NAND gate;
a second inverter chain for delaying the output of the fourth NAND gate; and
a fifth NAND gate for receiving outputs of the fourth inverter and the second inverter chain and outputting the reset signal.

6. The thermosensor as recited in claim 5, wherein the counter counts the number of toggles of the period signals, outputs count signals and initializes the count signals in response to the reset signal delayed by the first inverter.

7. The thermosensor as recited in claim 6, wherein the storage unit includes;
a register for storing the outputs of the temperature sensing unit, outputting stored values in response to an output activation signal and initializing the stored values in response to the initializing signal of the initializing unit; and
an output driver for driving outputs of the register as the temperature values.

8. The thermosensor as recited in claim 7, wherein the register includes a plurality of latch units for storing the outputs of the temperature sensing unit into unit bits.

9. The thermosensor as recited in claim 8, wherein the latch unit includes:
a latch for latching the outputs of the temperature sensing unit and being reset in response to the initializing signal; and
a transmission gate for transmitting an output of the latch in response to the output activation signal.

10. The thermosensor as recited in claim 9, wherein the temperature sensing unit includes:
a temperature sensor for sensing the temperature in response to the driving signal;
a voltage supplier for supplying an upper limit voltage and a lower limit voltage; and
a converter unit for converting an analog output of the temperature sensor into digital signals based on the upper limit voltage and the lower limit voltage in response to the driving signal.

* * * * *